United States Patent [19]

Tateno et al.

[11] Patent Number: 5,751,233
[45] Date of Patent: May 12, 1998

[54] DECODING APPARATUS AND METHOD THEREFOR

[75] Inventors: Tetsuya Tateno, Hadano; Yuji Minami, Tokyo, both of Japan

[73] Assignee: Canon Kabushiki Kaisha, Tokyo, Japan

[21] Appl. No.: 644,246

[22] Filed: May 10, 1996

[30] Foreign Application Priority Data

May 19, 1995 [JP] Japan .................................. 7-121504

[51] Int. Cl.$^6$ .................................................. H03M 7/40
[52] U.S. Cl. ........................ 341/67; 341/65; 341/106
[58] Field of Search ............................ 341/67, 65, 106, 341/107

[56] References Cited

U.S. PATENT DOCUMENTS

| | | | |
|---|---|---|---|
| 4,475,174 | 10/1984 | Kanayama | 364/900 |
| 4,591,829 | 5/1986 | Takeda | 340/347 DD |
| 5,227,789 | 7/1993 | Barry et al. | 341/65 |
| 5,254,991 | 10/1993 | Ruetz et al. | 341/65 |
| 5,268,769 | 12/1993 | Tsuchiya et al. | 358/427 |

*Primary Examiner*—Marc S. Hoff
*Assistant Examiner*—Jason L. W. Kost
*Attorney, Agent, or Firm*—Fitzpatrick, Cella, Harper & Scinto

[57] ABSTRACT

A decoder decodes input codes, such as Modified Huffman, Modified READ, and Modified Modified READ codes, and includes a zero bit detector which detects the number of consecutive leading zero bits of the input code. An address compressor forms address data by performing a logical operation of data indicating the number of detected zero bits and data excluding the consecutive leading zero bits and the next one bit of the data. A reference table for code conversion is addressed by the formed address data from the address compressor and outputs decoded data corresponding to the input code.

8 Claims, 18 Drawing Sheets

| COLOR | NUMER OF ZEROS | | | ADDRESS EFFECTIVE AREA | | |
|---|---|---|---|---|---|---|
| A10 | A9 | A8 | A7 | 0 | A6~A0 | 128 |
| 0 | 0 | 0 | 0 | (A) | | |
| 0 | 0 | 0 | 1 | | (B) | |
| 0 | 0 | 1 | 0 | (C) | | |
| 0 | 0 | 1 | 1 | (D) | | |
| 0 | 1 | 0 | 0 | (E) | | |
| 0 | 1 | 0 | 1 | (F) | | |
| 0 | 1 | 1 | 0 | (G) | | |
| 0 | 1 | 1 | 1 | (H) | | |
| 1 | 0 | 0 | 0 | (I) | | |
| 1 | 0 | 0 | 1 | (J) | | |
| 1 | 0 | 1 | 0 | (K) | | |
| 1 | 0 | 1 | 1 | (L) | | |
| 1 | 1 | 0 | 0 | | (M) | |
| 1 | 1 | 0 | 1 | (N) | | |
| 1 | 1 | 1 | 0 | (O) | | |
| 1 | 1 | 1 | 1 | (P) | | |

| COLOR | NUMER OF ZEROS | | | ADDRESS EFFECTIVE AREA | | |
|---|---|---|---|---|---|---|
| A10 | A9 | A8 | A7 | 0 | A6~A0 | 128 |
| 0 | 0 | 0 | 0 | (A) | | |
| 0 | 0 | 0 | 1 | | (B) | |
| 0 | 0 | 1 | 0 | (C) | | |
| 0 | 0 | 1 | 1 | (D) | | |
| 0 | 1 | 0 | 0 | (E) | | |
| 0 | 1 | 0 | 1 | (F) | | |
| 0 | 1 | 1 | 0 | (G) | | |
| 0 | 1 | 1 | 1 | (H) | | |
| 1 | 0 | 0 | 0 | | (M) | |
| 1 | 0 | 0 | 1 | (N) | | |
| 1 | 0 | 1 | 0 | (O) | | |
| 1 | 0 | 1 | 1 | (P) | | |
| 1 | 1 | 0 | 0 | (I) | | |
| 1 | 1 | 0 | 1 | (J) | | |
| 1 | 1 | 1 | 0 | (K) | | |
| 1 | 1 | 1 | 1 | (L) | | |

| COLOR | NUMBER OF ZEROS | | | ADDRESS EFFECTIVE AREA | | |
|---|---|---|---|---|---|---|
| A10 | A9 | A8 | A7 | 0 | A6~A0 | 128 |
| 0 | 0 | 0 | 0 | (A) | | |
| 0 | 0 | 0 | 1 | (B) | | |
| 0 | 0 | 1 | 0 | (C) | | |
| 0 | 0 | 1 | 1 | | (D) (E) (F) (G) (H) | |
| 0 | 1 | 0 | 0 | | | |
| 0 | 1 | 0 | 1 | | | |
| 0 | 1 | 1 | 0 | | | |
| 0 | 1 | 1 | 1 | | | |
| 1 | 0 | 0 | 0 | (M) | | |
| 1 | 0 | 0 | 1 | (N) | | |
| 1 | 0 | 1 | 0 | (O) | | |
| 1 | 0 | 1 | 1 | | (P) (I) (J) (K) (L) | |
| 1 | 1 | 0 | 0 | | | |
| 1 | 1 | 0 | 1 | | | |
| 1 | 1 | 1 | 0 | | | |
| 1 | 1 | 1 | 1 | | | |

| COLOR | NUMER OF ZEROS | | | ADDRESS EFFECTIVE AREA | | |
|---|---|---|---|---|---|---|
| A10 | A9 | A8 | A7 | 0 | A6~A0 | 128 |
| 0 | 0 | 0 | 0 | (A) | | |
| 0 | 0 | 0 | 1 | (B) | | |
| 0 | 0 | 1 | 0 | (C) | | |
| 0 | 0 | 1 | 1 | | (D) (E) (F) (G) (H) | |
| 0 | 1 | 0 | 0 | | | |
| 0 | 1 | 0 | 1 | | | |
| 0 | 1 | 1 | 0 | | | |
| 0 | 1 | 1 | 1 | | | |
| 1 | 0 | 0 | 0 | (N) | | |
| 1 | 0 | 0 | 1 | (M) | | |
| 1 | 0 | 1 | 0 | (O) | | |
| 1 | 0 | 1 | 1 | | (P) (I) (J) (K) (L) | |
| 1 | 1 | 0 | 0 | | | |
| 1 | 1 | 0 | 1 | | | |
| 1 | 1 | 1 | 0 | | | |
| 1 | 1 | 1 | 1 | | | |

| COLOR | NUMBER OF ZEROS | | | ADDRESS EFFECTIVE AREA | | |
|---|---|---|---|---|---|---|
| A10 | A9 | A8 | A7 | 0 | A6~A0 | 128 |
| 0 | 0 | 0 | 0 | | | |
| 0 | 0 | 0 | 1 | (B) | | |
| 0 | 0 | 1 | 0 | (A) | (C) | |
| 0 | 0 | 1 | 1 | (D) (E) (F) (G) (H) | | |
| 0 | 1 | 0 | 0 | | | |
| 0 | 1 | 0 | 1 | | | |
| 0 | 1 | 1 | 0 | | | |
| 0 | 1 | 1 | 1 | | | |
| 1 | 0 | 0 | 0 | | | |
| 1 | 0 | 0 | 1 | (M) | | |
| 1 | 0 | 1 | 0 | (N) | (O) | |
| 1 | 0 | 1 | 1 | (P) (I) (J) (K) (L) | | |
| 1 | 1 | 0 | 0 | | | |
| 1 | 1 | 0 | 1 | | | |
| 1 | 1 | 1 | 0 | | | |
| 1 | 1 | 1 | 1 | | | |

| COLOR | NUMBER OF ZEROS | | | ADDRESS EFFECTIVE AREA |
|---|---|---|---|---|
| A10 | A9 | A8 | A7 | 0 — A6~A0 — 128 |
| 0 | 0 | 0 | 0 | (MR) |
| 0 | 0 | 0 | 1 | (B) |
| 0 | 0 | 1 | 0 | (A)    (C) |
| 0 | 0 | 1 | 1 | (D) (E) (F) (G) (H) |
| 0 | 1 | 0 | 0 | |
| 0 | 1 | 0 | 1 | |
| 0 | 1 | 1 | 0 | |
| 0 | 1 | 1 | 1 | |
| 1 | 0 | 0 | 0 | (MR) |
| 1 | 0 | 0 | 1 | (M) |
| 1 | 0 | 1 | 0 | (N)    (O) |
| 1 | 0 | 1 | 1 | (P) (I) (J) (K) (L) |
| 1 | 1 | 0 | 0 | |
| 1 | 1 | 0 | 1 | |
| 1 | 1 | 1 | 0 | |
| 1 | 1 | 1 | 1 | |

| COLOR | NUMER OF ZEROS | | | ADDRESS EFFECTIVE AREA | | | | | |
|---|---|---|---|---|---|---|---|---|---|
| A10 | A9 | A8 | A7 | 0 | | A6~A0 | | | 128 |
| 0 | 0 | 0 | 0 | V0 | H | P | V0 | H | P |
| 0 | 0 | 0 | 1 | VL1 VR2 VL2 VR2 VL3 VR3 | (B) | | VL1 VR2 VL2 VR2 VL3 VR3 | | |
| 0 | 0 | 1 | 0 | (A) | | | (C) | | |
| 0 | 0 | 1 | 1 | | (D) | (E) | (F) | (G) | (H) |
| 0 | 1 | 0 | 0 | | | | | | |
| 0 | 1 | 0 | 1 | | | | | | |
| 0 | 1 | 1 | 0 | | | | | | |
| 0 | 1 | 1 | 1 | | | | | | |
| 1 | 0 | 0 | 0 | V0 | H | P | V0 | H | P |
| 1 | 0 | 0 | 1 | VL1 VR2 VL2 VR2 VL3 VR3 | (M) | | VL1 VR2 VL2 VR2 VL3 VR3 | | |
| 1 | 0 | 1 | 0 | (N) | | | (O) | | |
| 1 | 0 | 1 | 1 | | (P) | (I) | (J) | (K) | (L) |
| 1 | 1 | 0 | 0 | | | | | | |
| 1 | 1 | 0 | 1 | | | | | | |
| 1 | 1 | 1 | 0 | | | | | | |
| 1 | 1 | 1 | 1 | | | | | | |

DECODING APPARATUS AND METHOD THEREFOR

BACKGROUND OF THE INVENTION

1. Field of the Invention

The present invention relates to a coding and decoding technology for the purpose of compressing and expanding image information for use in image processing systems, such as facsimiles or electronic filing systems. More particularly, the present invention relates to a decoding apparatus and method for decoding Modified Huffman (MH), Modified READ (MR), and Modified Modified READ (MMR) codes in conformity with the CCITT recommendations.

2. Description of the Related Art

Hitherto, when image data having a large amount of data is recorded in a recording apparatus or transmitted by a communication apparatus, it is a common practice to reduce the amount of information by using data compression technology so as to record and transmit such information efficiently, and thus data compression and expansion technology has become an extremely important technology in the field of image processing. At the present time, the scheme which is most generally and widely used from among the compression and expansion technologies are MH, MR and MMR codes. There is, however, a demand for a technology for efficiently decoding these codes at a high speed.

Hitherto, when image data is decoded from the MH, MR, and MMR codes, a method is used in which the respective MH, MR and MMR codes are input to a conversion table made of a ROM or RAM, and information necessary for decoding is obtained from the conversion table. In order to perform this decoding process at a high speed, the operation of referencing the conversion table must be performed within one clock interval. For this purpose, an extremely large conversion table must be prepared.

For example, in MH codes, the information which has to be written beforehand in the conversion table in order to decode the codes are the run length and the code length of each code. In MR and MMR codes, that information includes, in addition to the information required in the MH codes, encoding mode information, such as Pass, VL1 to VL3, VR1 to VR3 and V0.

FIG. 1 is a block diagram of a conventional decoder employing a conversion table. Reference numeral 1 denotes a code data register for holding code data, in which code data register the contents are updated each time new code data is required. Reference numeral 2 denotes a shifter which provides a pointer to the beginning of a variable-length code, which shifter finds the beginning of the next code by the shift amount data. Reference numeral 3 denotes a reference table for code conversion which, when code data is input from the shifter 2, outputs information necessary for decoding the code data. Reference numeral 4 denotes a code length accumulator for accumulating the code length information which is output from the reference table 3 and for supplying a precise shift amount to the shifter 2 so that the shifter 2 is able to make the pointer move to the beginning of the next code.

The operation of the conventional decoder shown in FIG. 1 will now be described using MH codes as an example. Tables 1 to 4 which follow later, show MH codes. Consecutively stored in the code data register 1 are MH codes of variable lengths starting with the first code. The format of the MH codes starts with an EOL (End of Line) code (000000000001) of 12 bits and ends with an RTC (Return to Control) code formed of a plurality of linked EOL codes. The lines are delimited by EOL codes. Rules are established in that the beginning of each line always starts with white, and a run length code indicating the number of consecutive pixels of that color continues in sequence from the beginning.

When the codes of one line in which there are 10 consecutive pixels of white followed by 4 consecutive pixels of black with the total number of pixels of the line being 14 are formed in accordance with the rules of Tables 1 to 4, the code becomes as follows in the form including the EOL code of the beginning of the code and the RTC formed of six EOL codes:

"000000000001001110110000000000100000000000100000000001-000000000001000000000001000000000001".

The code described above is stored in the code data register 1. The code length accumulator 4 is set to the initial value 0 when decoding starts.

The pointer to the beginning of the code data register 1 is initially set in the shifter 2. Thus, data of predetermined bits from the beginning of the code data register 1 is supplied via the shifter 2 to the reference table 3 for code conversion. Code length data, run length data, or a code indicating the meaning of the code are output from the reference table 3 in accordance with the color information to be converted and the input from the shifter 2.

When Tables 1 to 4 are taken note of here, since the longest code length is 13, the input supplied to the reference table 3 for code conversion may be the information indicating the color to be converted and 13 bits from the shifter 2. Therefore, the input supplied first is the color information indicating white and "0000000000010" from the shifter 2. The reference table 3 for code conversion outputs 12 as the code length data and a code indicating EOL with respect to the above-described input.

The code length data is input to the code length accumulator 4, and added to 0, which is the initial value of the code length accumulator 4. As a result, the pointer which indicates the beginning of the code data register 1 shifts to the 12-th position counting from 0, and the shifter 2 supplies the next code to the reference table 3 for code conversion in accordance with this new pointer. As a result, "0011101100000" and the color information of white are input to the reference table 3 for code conversion. The reference table 3 for code conversion outputs 5 as the code length data, and a code indicating the run length of 10 pixels as the run length data.

The code length data is input to the code length accumulator 4, and added to 12, which is the current value. As a result, the pointer which indicates the beginning of the code of the code data register 1 moves to the 17-th position counting from 0. The shifter 2 supplies the next code to the reference table 3 for code conversion in accordance with this pointer. As a result, "0110000000000" and the color information of black are input to the reference table 3 for code conversion. The reference table 3 for code conversion outputs 3 as the code length data, and a code indicating the run length of 4 pixels as the run length data. The code length data is input to the code length accumulator 4, and added to 17, which is the current value. As a result, the pointer which indicates the beginning of the code of the code data register 1 moves to the 20-th position counting from 0. The shifter 2 supplies the next code to the reference table 3 for code conversion in accordance with this pointer. Thereafter, the same process is repeated, and the decoding operation is continued until an RTC is detected.

However, in the above-described prior art, since a reference table for code conversion is created, a ROM or RAM of 16K words having an address of a total of 14 bits: 13 bits as code input and one bit as color information becomes necessary. When the reference table for code conversion is contained in a semiconductor integrated circuit, problems occur, for example, the chip area and costs increase.

SUMMARY OF THE INVENTION

The present invention has been achieved in view of the above-described problems. It is an object of the present invention to provide a decoding apparatus suitable for integration which is capable of reducing the size of a reference table for code conversion and capable of decoding all MH, MR, and MMR codes without deteriorating the signal processing speed.

To achieve the above-described object, the present invention provides a decoding apparatus for decoding codes, such as Modified Huffman, Modified READ, and Modified Modified READ codes, the decoding apparatus includes: detecting means for detecting a number of consecutive leading zero bits of a code to be decoded; forming means for forming address data by performing a logical operation of data indicating the number of zero bits detected by the detecting means and data excluding the consecutive leading zero bits and a next one bit of the data; and decoding means comprising a table which is addressed by the address data formed by the forming means and which outputs a decoded result corresponding to the code, wherein the forming means forms address data so as to reduce the address data by which the table is accessed.

The above and further objects, aspects and novel features of the invention will become more apparent from the following detailed description when read in connection with the accompanying drawings.

DESCRIPTION OF THE PREFERRED EMBODIMENTS

Preferred embodiments of the present invention will be described below with reference to the accompanying drawings.

[First Embodiment]

Figure 1:
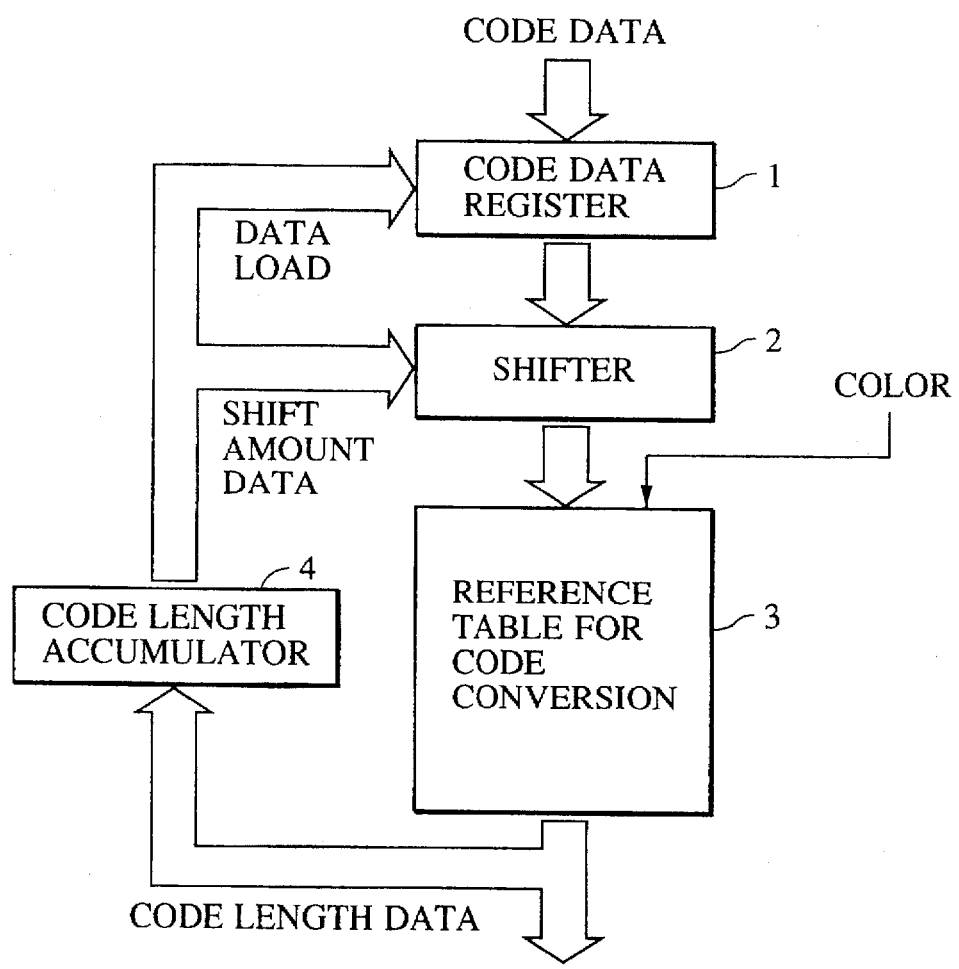
FIG. 1 is a block diagram of a conventional decoder.
Figure 2:
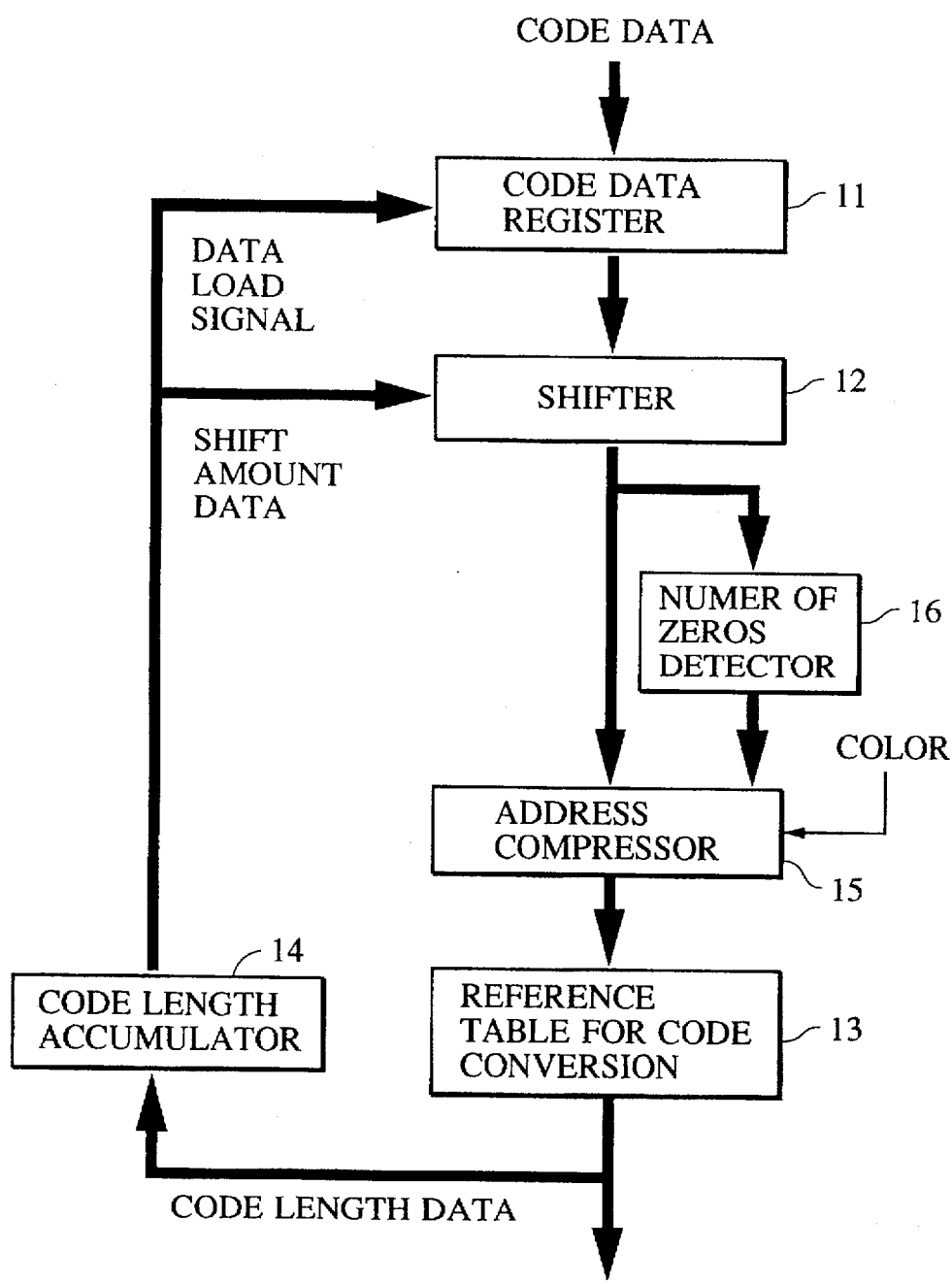
FIG. 2 is a block diagram of a first embodiment of a decoder according to the present invention.

FIG. 2 shows a first embodiment of a decoder to which the present invention is applied. Reference numeral 11 denotes a code data register. Reference numeral 12 denotes a shifter. Reference numeral 13 denotes a reference table for code conversion. Reference numeral 14 denotes a code length accumulator. These components are substantially the same as those of the prior art shown in FIG. 1. However, in FIG. 2, an address compressor 15 and a number of zeros detector 16 are provided between the shifter 12 and the reference table 13 for code conversion. With these components, the number of address bits for the reference table 13 is reduced.

FIGS. 3A and 3B, 4A and 4B, and 5A and 5B show an example of a realization process of the first embodiment. FIG. 6 is a circuit diagram of the address compressor 15.

Referring to FIG. 2, reference numeral 11 denotes a code data register for holding code data. Reference numeral 12 denotes a shifter for taking out codes one by one from a code string. Reference numeral 16 denotes a number of zeros detector for counting the number of consecutive leading zeros of the code and for outputting a binary number indicative of the count. Reference numeral 15 denotes an address compressor for forming address data to be transferred to the reference table 13 for code conversion on the basis of the code data from the shifter 12 and the detected number of zeros from the number of zeros detector 16. Reference numeral 13 denotes a reference table for code conversion which is addressed by the address data from the address compressor 15 and which outputs a run length and a code length data that the code data indicates. Reference numeral 14 denotes a code length accumulator for accumulating the code length of the code being decoded from among the outputs from the reference table 13 for code conversion and for producing a shift amount signal by which the next code is selected by the shifter 12 and a data load signal by which a new code group is loaded from a code memory or the like by the code data register 11.

Tables 1 to 4 show MH codes which are determined in conformity with a CCITT recommendation. The MH code is broadly classified into a terminating code and a makeup code. The code is uniquely determined by the number of consecutive white pixels and consecutive black pixels with respect to the main scanning direction. For example, when there are five consecutive white pixels, as shown in the line whose white run length is 5 in the terminating code of Table 1, the MH code at this time is "1100". When there are ten consecutive black pixels, similarly to that described above, the MH code is "0000100" from the line whose black run length is 10 in the terminating code of Table 1. Further, when the number of consecutive white or black pixels exceeds 64, a required run length is formed by combining the makeup code of Table 3 and the terminating code of Table 1 or 2.

Here, when Tables 1 to 4 are taken note of, it can be seen that the number of zero bits added to the beginning of each code, excluding the EOL code, is a maximum of 7 bits. Further, excluding the consecutive leading zero bits and the next one bit, the maximum code length that remains is 7 bits.

Figures 3A, 3B:
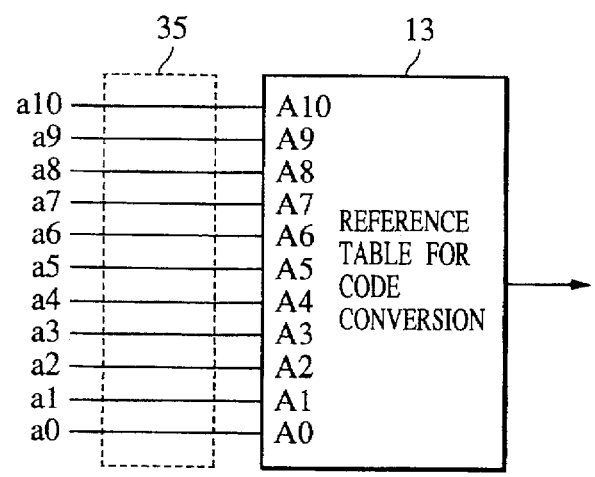
FIGS. 3A and 3B show a realization process of a first embodiment of the present invention.

FIG. 3A shows the effective data area within the reference table 13 for code conversion, also shown is the initial stage of a realization process of the address compressor 15 of FIG. 2.

A0 to A10 in FIG. 3A are address terminals of the reference table 13 for code conversion of FIG. 2. The output of the address shifter 15 is connected to A0 to A10. In this initial stage of the realization process, A10 is a terminal to which a signal indicating color information is input as an address, and 0 represents white, and 1 represents black. A9, A8, and A7 are terminals to which a signal indicating the number of leading zeros of each code is input as an address from the number of zeros detector 16. Since the number of zeros added to the beginning of each code, excluding the EOL code, is a maximum of 7 as described above, it can be seen that only the three bits of A9, A8, and A7 are required. In A6 to A0, an effective data area is indicated by the slanted line, which is calculated from the number of effective low-order bits of the code having color and the number of zeros, which are determined from A10 to A7.

To make the explanation easy to understand, the number of low-order effective bits is represented justified to the LSB side of the low-order 7 bits. That is, since the remaining length of the code in which a leading one bit is excluded from the MH code which is a white code and whose number of leading zeros is zero is a maximum of 5 from Tables 1 to 4, the number of representable codes is 32 or less. When the code is shown justified to the LSB side, an area shown by (A) of FIG. 3A is formed. Since the remaining length of the code excluding the consecutive leading zero bits and the next one bit from the MH code, which is a white code and whose number of leading zeros is three is a maximum of 4 from Tables 1 to 4, the number of representable codes is 16 or less. When the code is shown justified to the LSB side, an area shown by (D) of FIG. 3A is formed. The same applies as well to the other cases, and are shown by (B) to (P) of FIG. 3A.

FIG. 3B shows the initial stage of the address compressing process explained in FIG. 3A. Reference numeral 13 is a reference table for code conversion whose contents are shown in FIG. 3A. The dotted line indicated by reference numeral 35 shows the contents of the address compressor 15 at this stage. As can be seen from FIG. 3B, the signal lines of a1 to a10 are simply connected as they are to the address terminals of the reference table 13 for code conversion. That is, a10, similarly to A10, indicates color information, and a9, a8, and a7, similarly to A9, A8, and A7, indicate the number of consecutive leading zeros. Also, a0 to a6, similarly to A0 to A6, indicate color information excluding the consecutive leading zero bits and the next one bit.

According to the construction of this embodiment having the number of zeros detector 16 shown in FIG. 2 as described above, the size of the reference table 13 for code conversion required for converting codes is 2K words, which is ⅛ of the 16K words shown in the prior art described earlier. However, in FIG. 3A, the area indicated by the slanted line which is filled with effective data from (A) to (P) is only 25% of the total address space. In particular, areas (D) to (H), (I) to (L), and (P) are a maximum of 13% or less of the respective address spaces. Therefore, the area in which areas (D) to (H), (I) to (L), and (P) are combined can be fitted to one address space determined by A7 to A10.

Figures 4A, 4B:
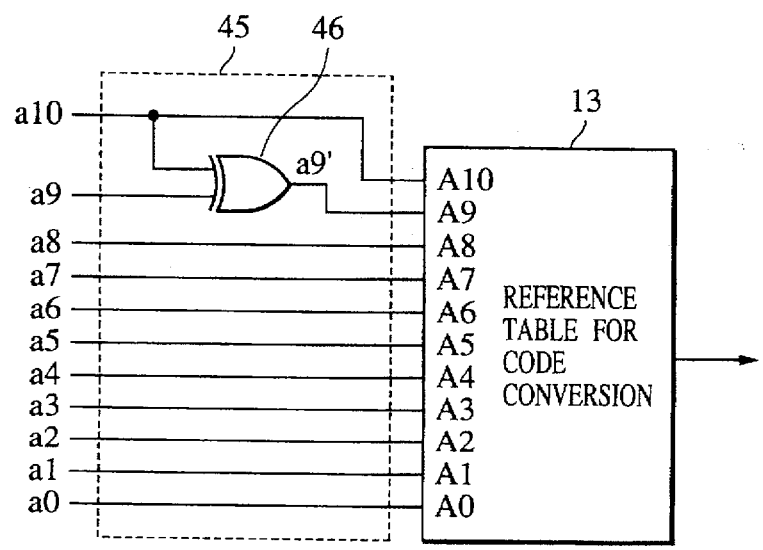
FIGS. 4A and 4B show another realization process of the first embodiment of the present invention.

FIGS. 4A and 4B show the next stage (a second stage) of the realization process of this embodiment. An area 45 indicated by the dotted line of FIG. 4B indicates the function added to the address compressor 15 in the embodiment of FIG. 2 at this stage of the realization process. In this stage, an exclusive OR circuit 46 of FIG. 4B accepts signal line a10 and signal line a9 as inputs and supplies an output to signal line a9'. At this stage, connected to address input terminal A9 of the reference table 13 for code conversion of FIG. 4B is a9' which is an output from the exclusive OR circuit 46 in place of a9 of FIG. 3B. The effective data area of the reference table 13 for code conversion at this time is the shaded area of FIG. 4A. As is clear from FIG. 4A, areas I, J, K, and L and areas M, N, O, and P have replaced those of FIG. 3A.

Figures 5A, 5B:
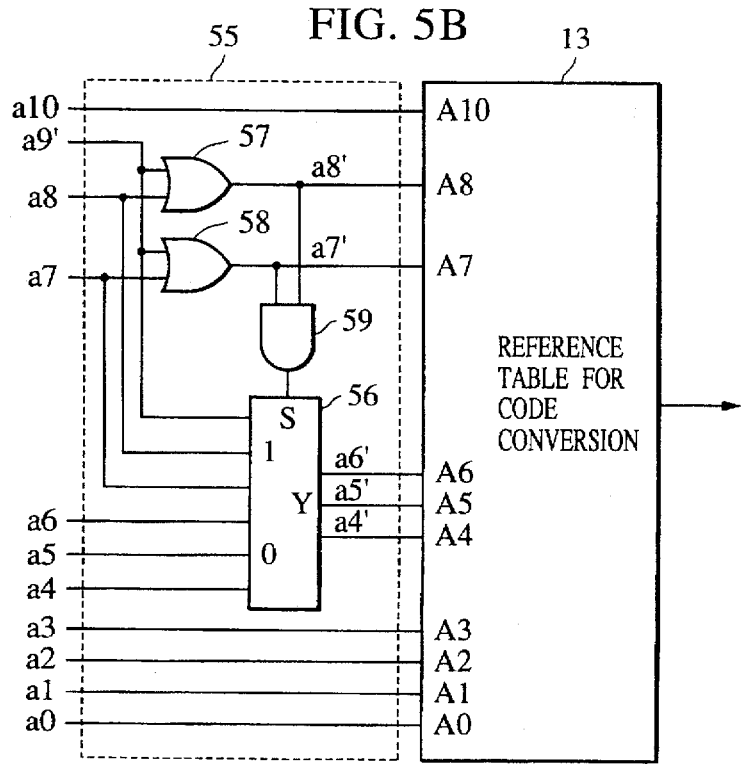
FIGS. 5A and 5B show yet another realization process of the first embodiment of the present invention.
Figure 6:
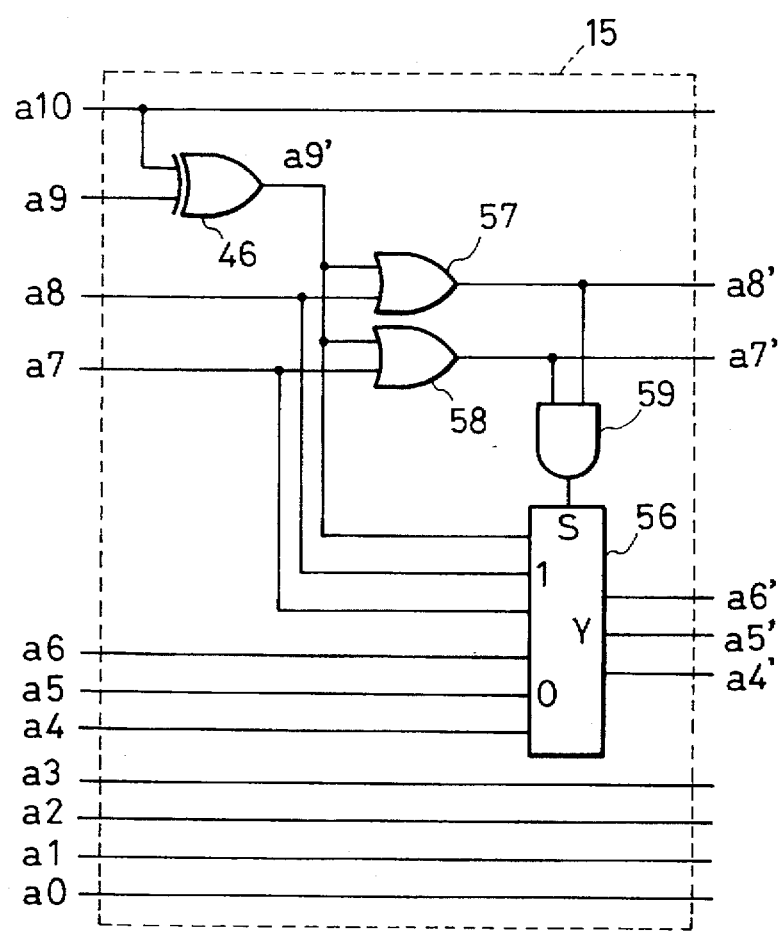
FIG. 6 is a circuit diagram of an address compressor in accordance with the first embodiment of the present invention.

FIGS. 5A and 5B show the next stage (a third stage) of the realization process of this embodiment. An area 55 indicated by the dotted line of FIG. 5B indicates a function which is newly added at the third stage to the address compressor 15 in the second embodiment at this stage of the realization process. Signal lines a0 to a8, a9', and a10 of FIG. 5B are the same as signal lines a0 to a8, a9', and a10 of FIG. 4B. An OR circuit 57 of FIG. 5B accepts signal lines a8 and a9' as inputs and supplies an output to signal line a8'. An OR circuit 58 accepts signal lines a7 and a9' as inputs and supplies an output to signal line a7'. An AND circuit 59 accepts signal lines a7' and a8' as inputs and supplies an output to the select input terminal S of a selector circuit 56.

The selector circuit 56, when select terminal S is "1", outputs signal lines a9', a8 and a7 to signal line a6', a5' and a4', respectively. When select terminal S is "0", the selector circuit 56 outputs signal lines a6, a5 and a4 to signal line a6', a5' and a4', respectively. At this stage, connected to the address input terminals A8, A7, A6, A5 and A4 of the reference table 13 for code conversion are a8', a7', a6', a5' and a4', in place of a8, a7, a6, a5 and a4 of FIG. 4B, respectively. The effective data area of the reference table 13 for code conversion at this time is the area indicated by the slanted line of FIG. 5A.

As a result, each of the areas D, E, F, G, and H, and P, I, J, K, and L having a small effective area is allocated in an address space having the same number of zeros. As a result, effective data is not present in the address space where address terminal A9 of the reference table 13 for code conversion is "1". Therefore, address terminal A9 is not required, and the size of the reference table 13 for code conversion necessary for converting codes becomes 1K words, which is 1/16 of the prior art. The construction of the address compressor 15 made by the above three processes is shown in FIG. 6.

[Second Embodiment]

Figure 7:
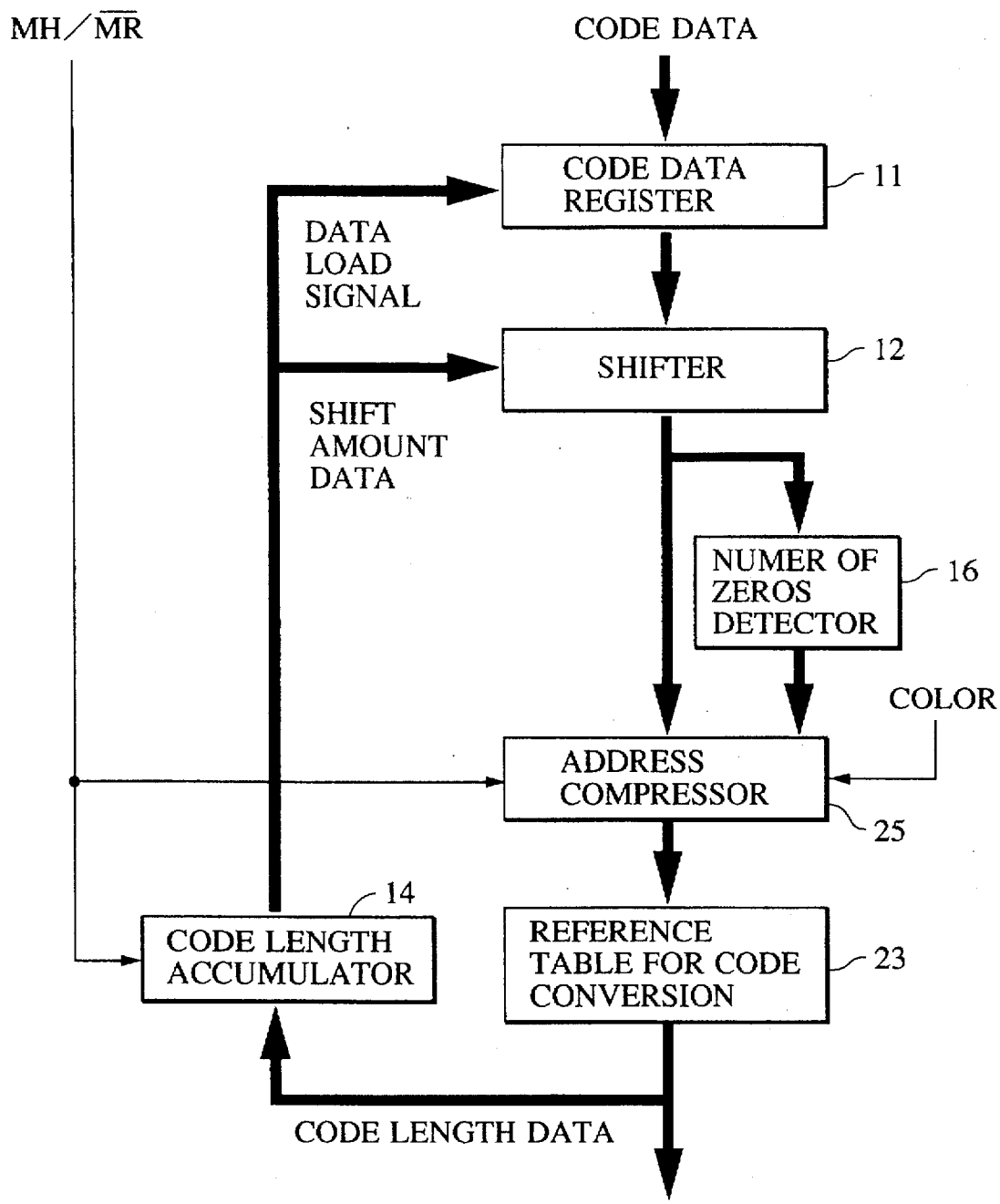
FIG. 7 is a block diagram of a second embodiment of a decoder according to the present invention.

FIG. 7 shows a second embodiment of the present invention. The code data register 11, the shifter 12 and the number of zeros detector 16 are the same as those of the embodiment of FIG. 2. Stored in a reference table 23 for code conversion is, in addition to data for decoding MH codes, data for decoding MR codes (identification information of MR codes and the code length thereof) shown in Table 5. An MH/$\overline{\text{MR}}$ signal indicating the type of codes to be decoded, in addition to the signal to the address compressor 15 shown in FIG. 2, is input to an address compressor 25 shown in FIG. 7.

Figure 8:
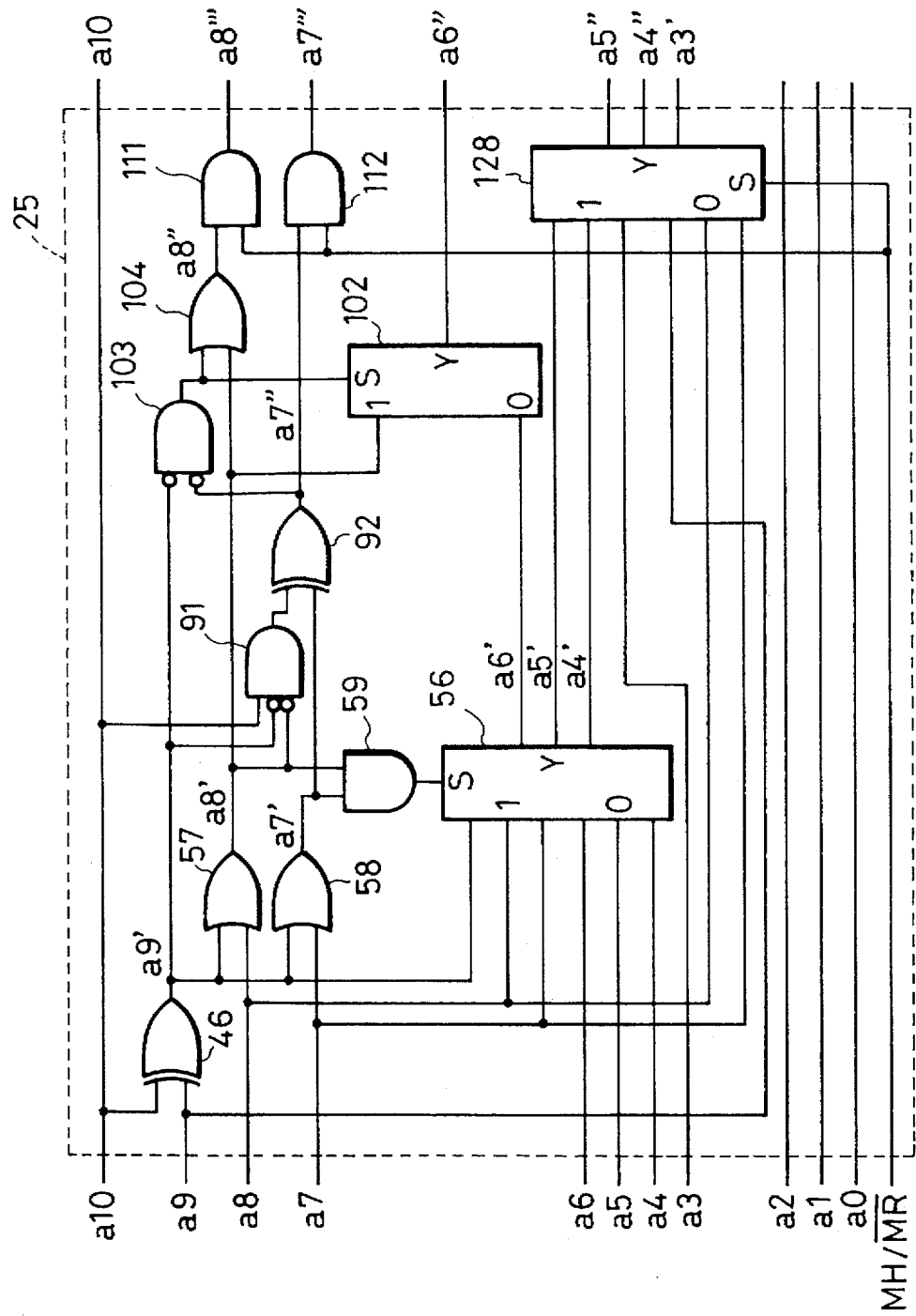
FIG. 8 is a circuit diagram of an address compressor in accordance with the second embodiment of the present invention.

FIG. 8 shows the construction of the address compressor 25 in accordance with the second embodiment. FIGS. 9A and 9B, 10A and 10B, 11A and 11B and 12A and 12B show the realization processes of the address compressor 25 in accordance with the second embodiment shown in FIG. 8.

Figures 9A, 9B:
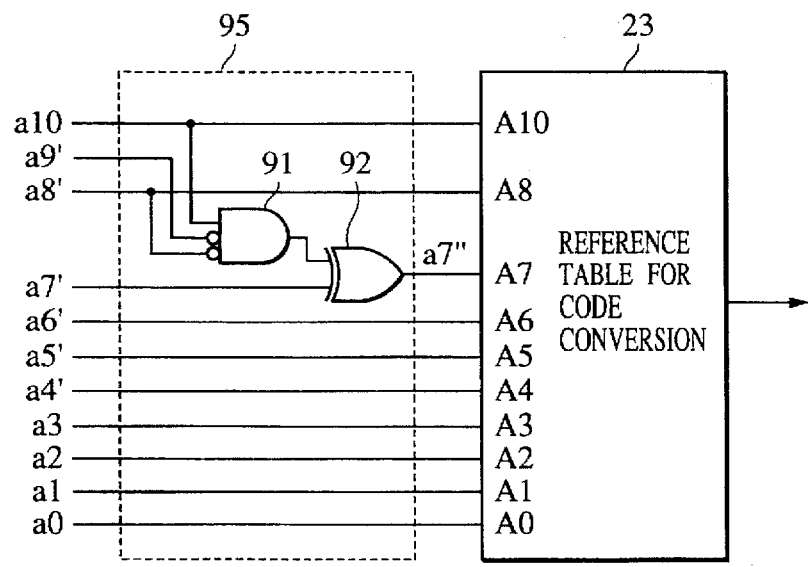
FIGS. 9A and 9B show a realization process of the second embodiment of the present invention.

FIG. 9A shows the next stage of FIG. 5B shown in the realization process of the above-described first embodiment. An area 95 indicated by the dotted line of FIG. 9B shows the function which is newly added at this stage to the address compressor 25 of the second embodiment. Signal lines a0 to a3, a4' to a9' and a10 in FIG. 9B are the same as signal lines a0 to a3, a4' to a9' and a10 in FIG. 5B.

An AND circuit 91 accepts signal line a10, the inversion of signal line a9' and the inversion of signal line a8' as inputs. An exclusive OR circuit 92 accepts the output of the AND circuit 91 and signal line a7' as inputs and provides an output to signal line a7". At this stage, a7", in place of a7' of FIG. 5B, is connected to address input terminal A7 of the reference table 23 for code conversion of FIG. 5B. The area of the reference table 23 for code conversion which is filled with effective data at this time is the area indicated by the slanted line in FIG. 9A. As is clear from FIG. 9A, areas M and N have replaced those of FIG. 5A.

Figures 10A, 10B:
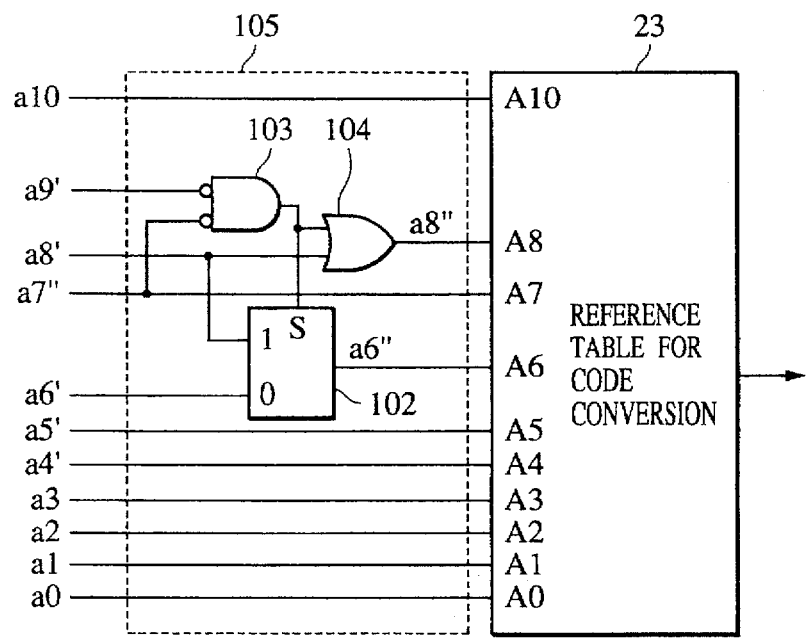
FIGS. 10A and 10B show another realization process of the second embodiment.

FIG. 10B shows the next stage (a second stage) of the realization process of the second embodiment. An area 105 indicated by the dotted line of FIG. 10B indicates the function which is newly added to the address compressor 25 at this stage of the realization process in accordance with the second embodiment. Signal lines a0 to a3, a4' to a6', a7", a8', a9" and a10 in FIG. 10B are the same as signal lines a0 to a3, a4' to a6', a7", a8', a9" and a10 in FIG. 9B. An AND circuit 103 accepts the inversion of signal line a9' and the inversion of signal line a7" as inputs. An OR circuit 104 accepts the output of the AND circuit 103 and signal line a8' as inputs and provides an output to signal line a8". A selector circuit 102 connects the output of the AND circuit 103 to the select input terminal S thereof. When S is "1", the selector circuit 102 outputs the value of signal line a8' to signal line a6", and when "0", the selector circuit 102 outputs the value of signal line a6' to signal line a6".

At this stage, a8", in place of a8' of FIG. 9B, is connected to address input terminal A8 of the reference table 23 for code conversion, and a6", in place of a6' of FIG. 9B, is connected to address input terminal A6. The area of the reference table 23 for code conversion which is filled with effective data at this time is an area indicated by the slanted line in FIG. 10A, and areas A and N which are positioned where the number of zeros is 0 are moved to the position where the number of zeros is 2 and the effective data area at the position where the number of zeros is 0 is not present. Therefore, no effective data area is present in the address space where both address terminals A8 and A7 are zero regardless of address terminal A10, and thus the area becomes usable for MR codes.

Figures 11A, 11B:
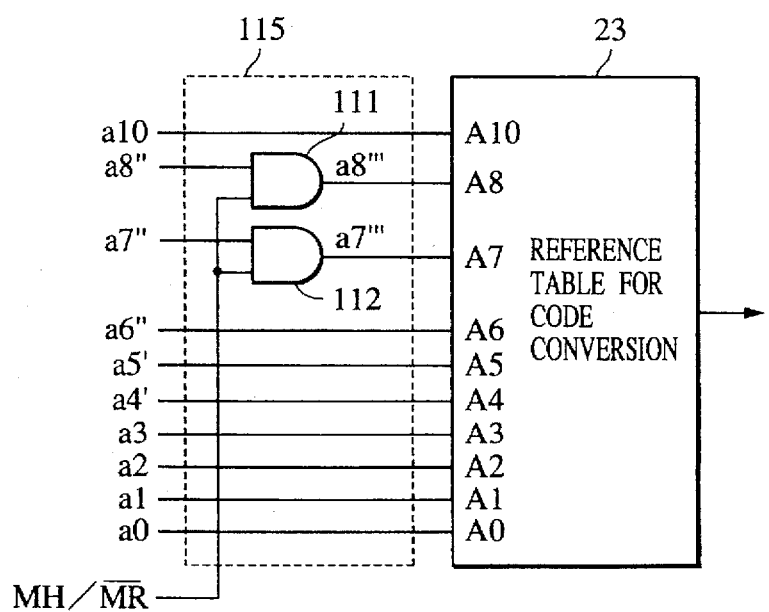
FIGS. 11A and 11B show yet another realization process of the second embodiment.

FIG. 11B shows the next stage (a third stage) in the realization process of the second embodiment. An area indicated by the dotted line of FIG. 11B shows the function which is newly added to the address compressor 25 in this stage of the realization process of the second embodiment. Signal lines a0 to a3, a4', a5', a6", a7", a8" and a10 in FIG. 11B are the same as signal lines a0 to a3, a4', a5', a6", a7", a8" and a10 in FIG. 10B. Signal line a8" is connected to one of the inputs of an AND circuit 111, and an MH/$\overline{MR}$ signal is input to the other input, and an output is connected to signal line a8'''. Signal line a7" is input to one of the inputs of an AND circuit 112, and an MH/$\overline{MR}$ signal is input to the other input, and an output is connected to signal line a7'''. At this stage, a7''', in place of a7" of FIG. 10B, is input to address input terminal A7 of the reference table 23 for code conversion, and a8''', in place of a8" of FIG. 10B, is input to address input terminal A8. As a result, when the MH/$\overline{MR}$ signal is "1", signal lines a7" and a8" are input as they are to address terminals A7 and A8 of the reference table 23 for code conversion, and used for MH codes. On the other hand, when the MH/$\overline{MR}$ signal is "0", a value "0" is input to address terminals A7 and A8 of the reference table 23 for code conversion, and used for MR codes. The area of the reference table 23 for code conversion which is filled with effective data at this time is the area indicated by the slanted line of FIG. 11A. The area where all A7, A8 and A9 which indicate the number of zeros are zero can be used for MR codes. Therefore, the reference table 23 for code conversion can be used in common for the MH and MR codes.

Figures 12A, 12B:
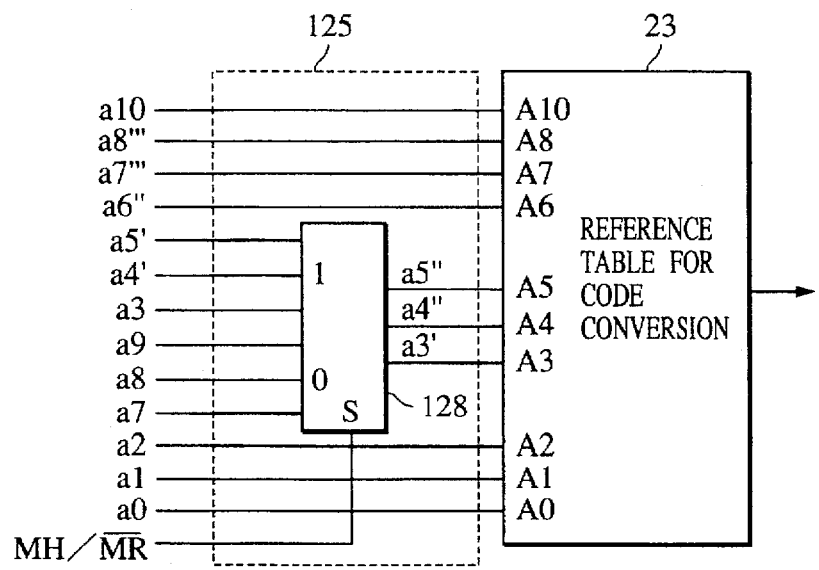
FIGS. 12A and 12B show still another realization process of the second embodiment of the present invention.

FIG. 12B shows the next stage (a fourth stage) in the realization process of the second embodiment. An area 125 indicated by the dotted line of FIG. 12B shows the function which is newly added to the address compressor 25 in this stage of the realization process of the second embodiment. Signal lines a0 to a3, a4', a5', a6", a7''', a8''', a10 and the MH/$\overline{MR}$ signal in FIG. 12B are the same as signal lines a0 to a3, a4', a5', a6", a7''', a8''', a10 and the MH/$\overline{MR}$ signal in FIG. 11B. Signal lines a7, a8, and a9 are the same as signal lines a7, a8 and a9 in FIG. 3B. The MH/$\overline{MR}$ signal is input to the select input terminal S of a selector circuit 128. When S is "1", the selector circuit 128 outputs the values of a5', a4' and a3 to signal lines a5", a4" and a3', respectively. When S is "0", the selector circuit 128 outputs the values of a9, a8 and a7 to signal lines a5", a4" and a3', respectively. At this stage, a5", in place of a5' of FIG. 11B, is connected to address input terminal A5 of the reference table 23 for code conversion, and a4", in place of a4' of FIG. 11B, is connected to address input terminal A4, and a3', in place of a3 of FIG. 11B, is connected to address input terminal A3. The area of the reference table 23 for code conversion which is filled with effective data at this time is the area indicated by the slanted line of FIG. 12A. The area of the table for MR codes when the MH/$\overline{MR}$ signal is set at 0 to form a reference table for code conversion for MR codes can be divided into the respective areas of V0, VL1, VR1, H, Pass, VL2, VR2, VL3, and VR3, which are codes for MR codes. FIG. 8 shows the construction of the address compressor 25 in accordance with the second embodiment made by the above processes.

[Third Embodiment]

Figure 13:
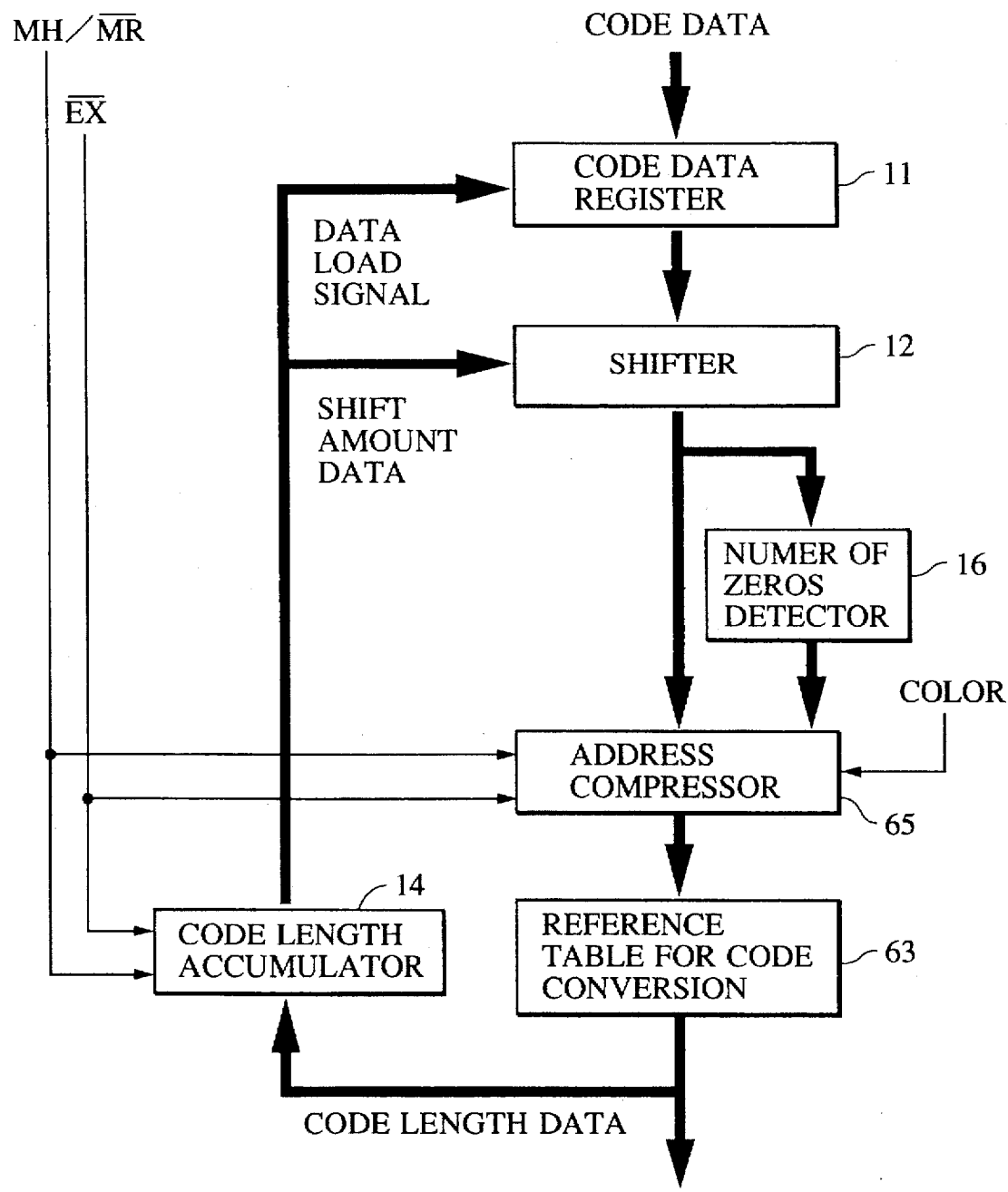
FIG. 13 is a block diagram of a third embodiment of a decoder according to the present invention.
Figure 14:
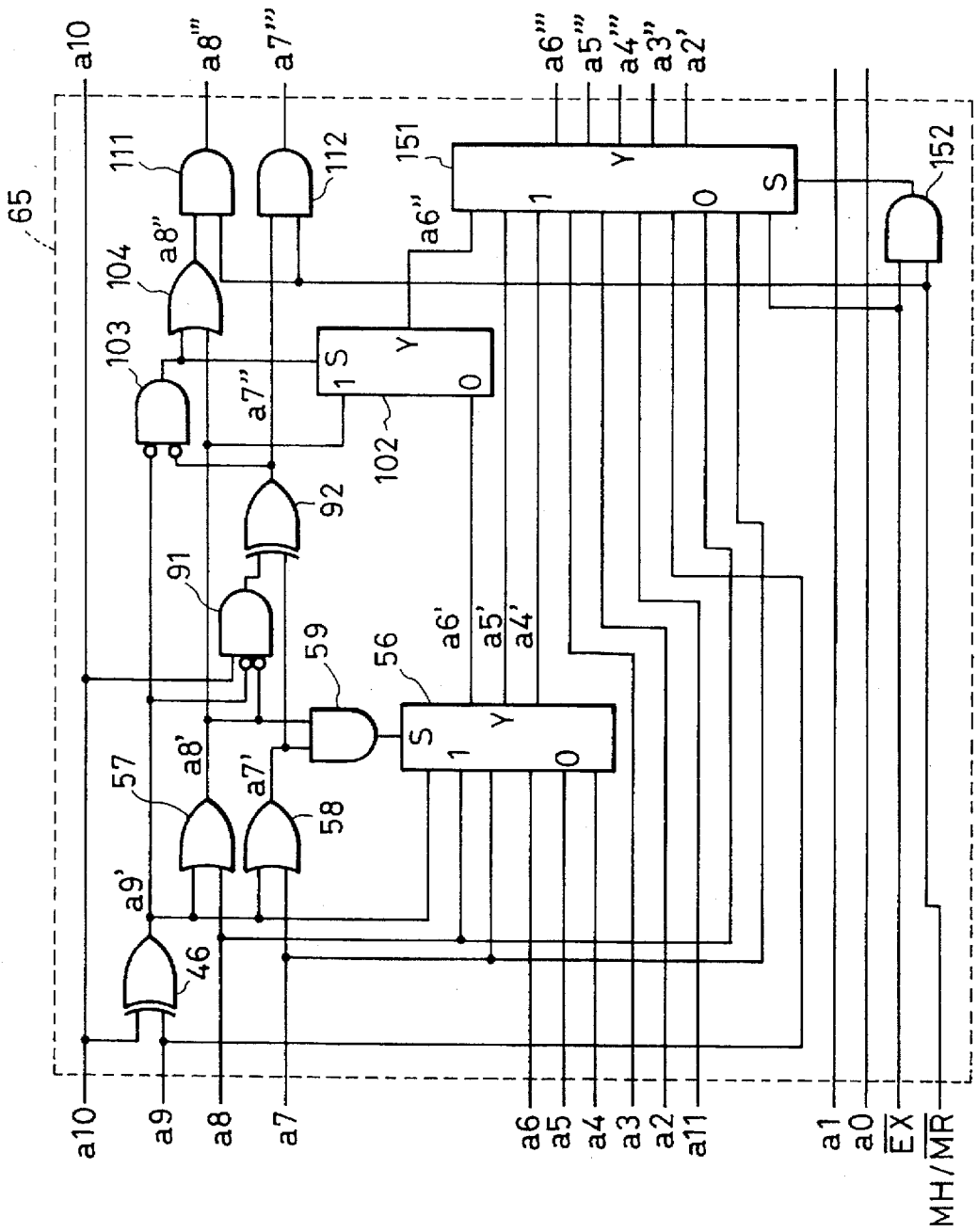
FIG. 14 is a circuit diagram of an address compressor in accordance with the third embodiment of the present invention.
Figure 15:
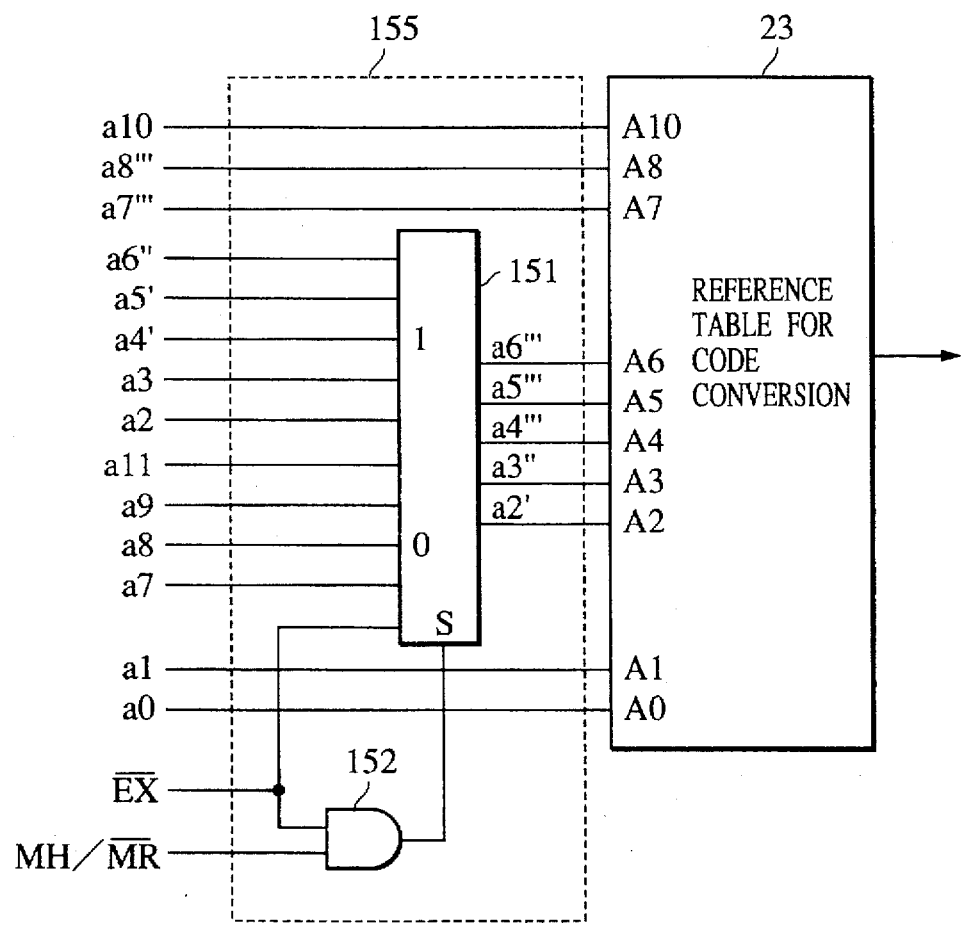
FIG. 15 shows a realization process of the third embodiment of the present invention.

FIG. 13 shows a third embodiment of the present invention. The code data register 11, the shifter 12 and the number of zeros detector 16 are the same as those of the second embodiment shown in FIG. 2. Decoded data of the EX code for the expansion mode shown in Table 6 is further stored in a reference table 63 for code conversion. The MH/$\overline{MR}$ signal indicating the type of codes to be decoded and the $\overline{EX}$ signal, in addition to the signal to the address compressor 15 of FIG. 2, is input to an address compressor 65 of FIG. 13. FIG. 15 shows a realization process of the address compressor 65 of FIG. 14.

FIG. 15 shows the next stage of FIG. 11B shown in the realization process of the above-described second embodiment. An output terminal of an AND circuit 152 is connected to select input terminal S of a selector circuit 151, and an MH/$\overline{MR}$ signal for switching between the MR mode and the MH mode is connected to one of the inputs of the AND circuit 152, and the expansion mode signal $\overline{EX}$ is connected to the other input of the AND circuit 152. When the output from the AND circuit 152 is "1", a6", a5', a4', a3 and a2 signal inputs are output via the selector circuit 151 to a6''',

TABLE 2-continued

Terminating Code (Continued)

| Run Length of White | Code | Run Length of Black | Code |
|---|---|---|---|
| 50 | 01010011 | 50 | 000001010010 |
| 51 | 01010100 | 51 | 000001010011 |
| 52 | 01010101 | 52 | 000000100100 |
| 53 | 00100100 | 53 | 000000110111 |
| 54 | 00100101 | 54 | 000000111000 |
| 55 | 01011000 | 55 | 000000100111 |
| 56 | 01011001 | 56 | 000000101000 |
| 57 | 01011010 | 57 | 000001011000 |
| 58 | 01011011 | 58 | 000001011001 |
| 59 | 01001010 | 59 | 000000101011 |
| 60 | 01001011 | 60 | 000000101100 |
| 61 | 00110010 | 61 | 000001011010 |
| 62 | 00110011 | 62 | 000001100110 |
| 63 | 00110100 | 63 | 000001100111 |

TABLE 3

Makeup Code

| Run Length of White | Code | Run Length of Black | Code |
|---|---|---|---|
| 64 | 11011 | 64 | 0000001111 |
| 128 | 10010 | 128 | 000011001000 |
| 192 | 010111 | 192 | 000011001001 |
| 256 | 0110111 | 256 | 000001011011 |
| 320 | 00110110 | 320 | 000000110011 |
| 384 | 00110111 | 384 | 000000110100 |
| 448 | 01100100 | 448 | 000000110101 |
| 512 | 01100101 | 512 | 0000001101100 |
| 576 | 01101000 | 576 | 0000001101101 |
| 640 | 01100111 | 640 | 0000001001010 |
| 704 | 011001100 | 704 | 0000001001011 |
| 768 | 011001101 | 768 | 0000001001100 |
| 832 | 011010010 | 832 | 0000001001101 |
| 896 | 011010011 | 896 | 0000001110010 |
| 960 | 011010100 | 960 | 0000001110011 |
| 1024 | 011010101 | 1024 | 0000001110100 |
| 1088 | 011010110 | 1088 | 0000001110101 |
| 1152 | 011010111 | 1152 | 0000001110110 |
| 1216 | 011011000 | 1216 | 0000001110111 |
| 1280 | 011011001 | 1280 | 0000001010010 |
| 1344 | 011011010 | 1344 | 0000001010011 |
| 1408 | 011011011 | 1408 | 0000001010100 |
| 1472 | 010011000 | 1472 | 0000001010101 |
| 1536 | 010011001 | 1536 | 0000001011010 |
| 1600 | 010011010 | 1600 | 0000001011011 |
| 1664 | 011000 | 1664 | 0000001100100 |
| 1728 | 010011011 | 1728 | 0000001100101 |
| EOL | 000000000001 | EOL | 000000000001 |

TABLE 4

| Run Length of White and Black | Makeup Code |
|---|---|
| 1792 | 00000001000 |
| 1856 | 00000001100 |
| 1920 | 00000001101 |
| 1984 | 000000010010 |
| 2048 | 000000010011 |
| 2112 | 000000010100 |
| 2176 | 000000010101 |
| 2240 | 000000010110 |
| 2304 | 000000010111 |
| 2368 | 000000011100 |
| 2432 | 000000011101 |
| 2496 | 000000011110 |
| 2560 | 000000011111 |

TABLE 5

MR Code

| Mode | Pixels to be coded | | Symbol | Code |
|---|---|---|---|---|
| Pass | r1, r2 | | P | 0001 |
| Horizontal | C0C1, C1C2 | | H | 0001 + H(C0C1) + (C1C2) |
| Vertical | C1 directly below R1 | C1r1=0 | V0 | 1 |
| | C1 right to R1 | C1r1=1 | VR1 | 011 |
| | | C1r1=2 | VR2 | 000011 |
| | | C1r1=3 | VR3 | 0000011 |
| | C1 left to R1 | C1r1=1 | VL1 | 010 |
| | | C1r1=2 | VL2 | 000010 |
| | | C1r1=3 | VL3 | 0000010 |

TABLE 6

Expansion Codes

| Code which enters expansion mode | Line on which coded in one dimension :00000001111 Line on which coded in two dimensions:0000001111 | |
|---|---|---|
| | Image pattern | Code |
| Expansion mode code | 1 | 1 |
| | 01 | 01 |
| | 001 | 001 |
| | 0001 | 0001 |
| | 00001 | 00001 |
| | 00000 | 000001 |
| Code which exits from expansion mode | 0 | 0000001T |
| | 00 | 00000001T |
| | 000 | 0000000001T |
| | 0000 | 0000000001T |

As has been described up to this point, in an apparatus for coding MH codes at a high speed by real-time processing, it becomes possible to reduce the size of a reference table for code conversion from, for example, 16K words to 1K words, and it becomes easy to form the decoding apparatus into an LSI. Also, it becomes possible to use the reference table for code conversion in common for MH and MR codes, and further it is possible to store the expansion mode code and the EOL code of CCITT in a table memory of a small size. In addition, by forming a reference table for code conversion so that the EOL code and the NULL code can be decoded together, high-speed search of the NULL code becomes possible.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A decoding apparatus for decoding codes which have been generated by encoding image data in accordance with one of Modified Huffman, Modified READ and Modified Modified READ encoding methods, said decoding apparatus comprising:

detecting means for detecting a number of consecutive leading zero bits of a code to be decoded;

a5''', a4''', a3'' and a2, respectively. When the output from the AND circuit 152 is "0", all, a9, a8, a7 and the $\overline{EX}$ signal inputs are output to a6''', a5''', a4''', a3'' and a2, respectively, and connected to terminals A6, A5, A4, A3 and A2 of the reference table 23 for code conversion, respectively.

A signal which becomes "1" when the number of leading zeros of the code is 8 or more is input from the number of zeros detector 16 of FIG. 13 to signal input all which is newly added in FIG. 15. As a result, input signals all, a9, a8 and a7 form an encoder output which counts the number of leading zeros of the code from 0 to 15.

The $\overline{EX}$ signal, when "0", indicates the decode state in the expansion mode in which the selector circuit 151 outputs all, a9, a8 and $\overline{EX}$ to a6''', a5''', a4''', a3'' and a2', and since $\overline{EX}$ is "0", "0" is always to input A2.

On the other hand, in the MR mode in which the $\overline{EX}$ is "1" and MH/$\overline{MR}$ is "0", the selector circuit 151 outputs all, a9, a8, a7 and $\overline{EX}$ to a6''', a5''', a4''', a3'' and a2', and since $\overline{EX}$ s "1", "1" is always to input A2. As a result, it becomes possible to store conversion data for MH codes, MR codes and expansion mode codes in the reference table 23 for code conversion.

[Fourth Embodiment]

Figure 16:
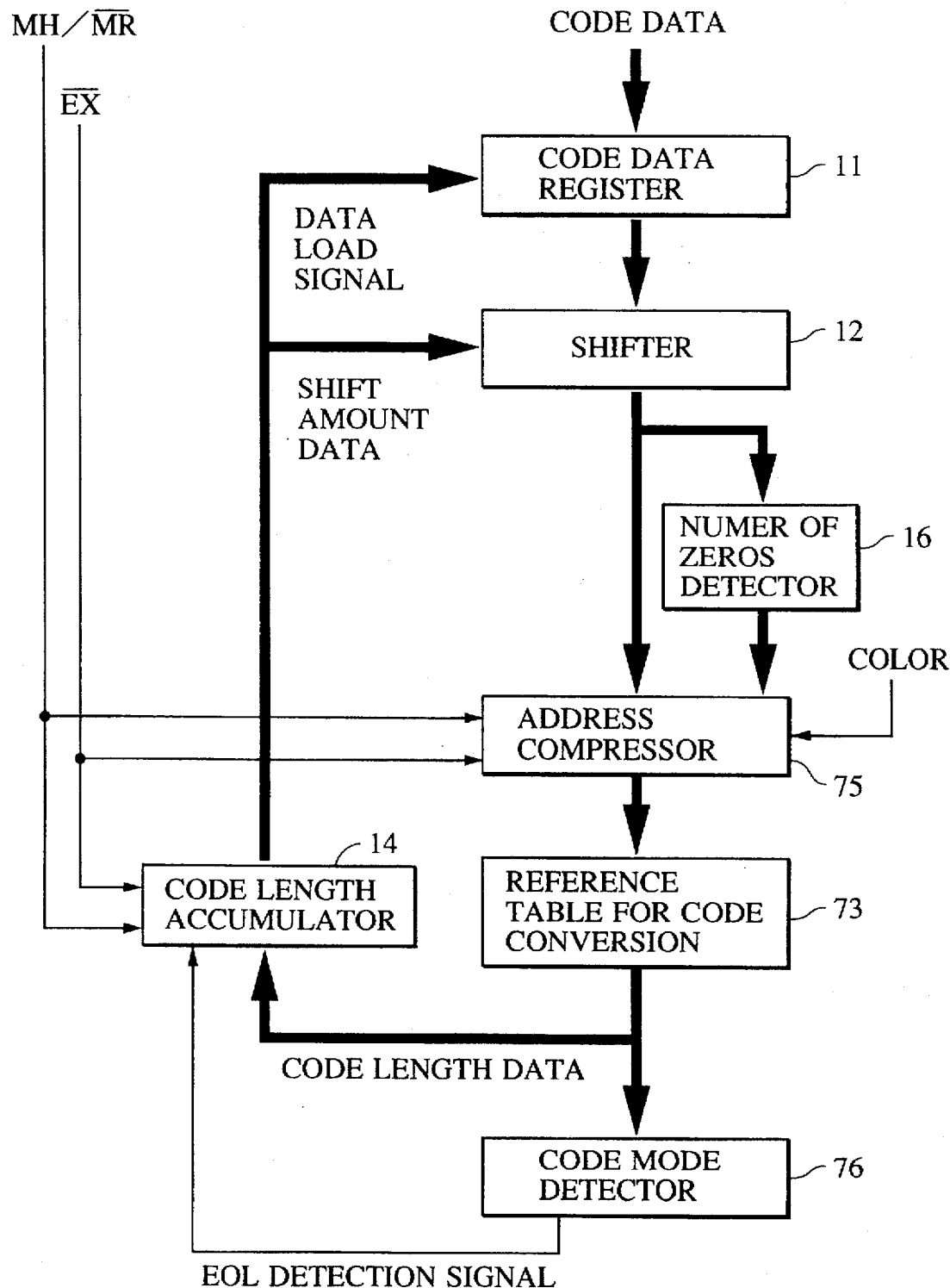
FIG. 16 is a block diagram of a fourth embodiment of a decoder according to the present invention.
Figure 17:
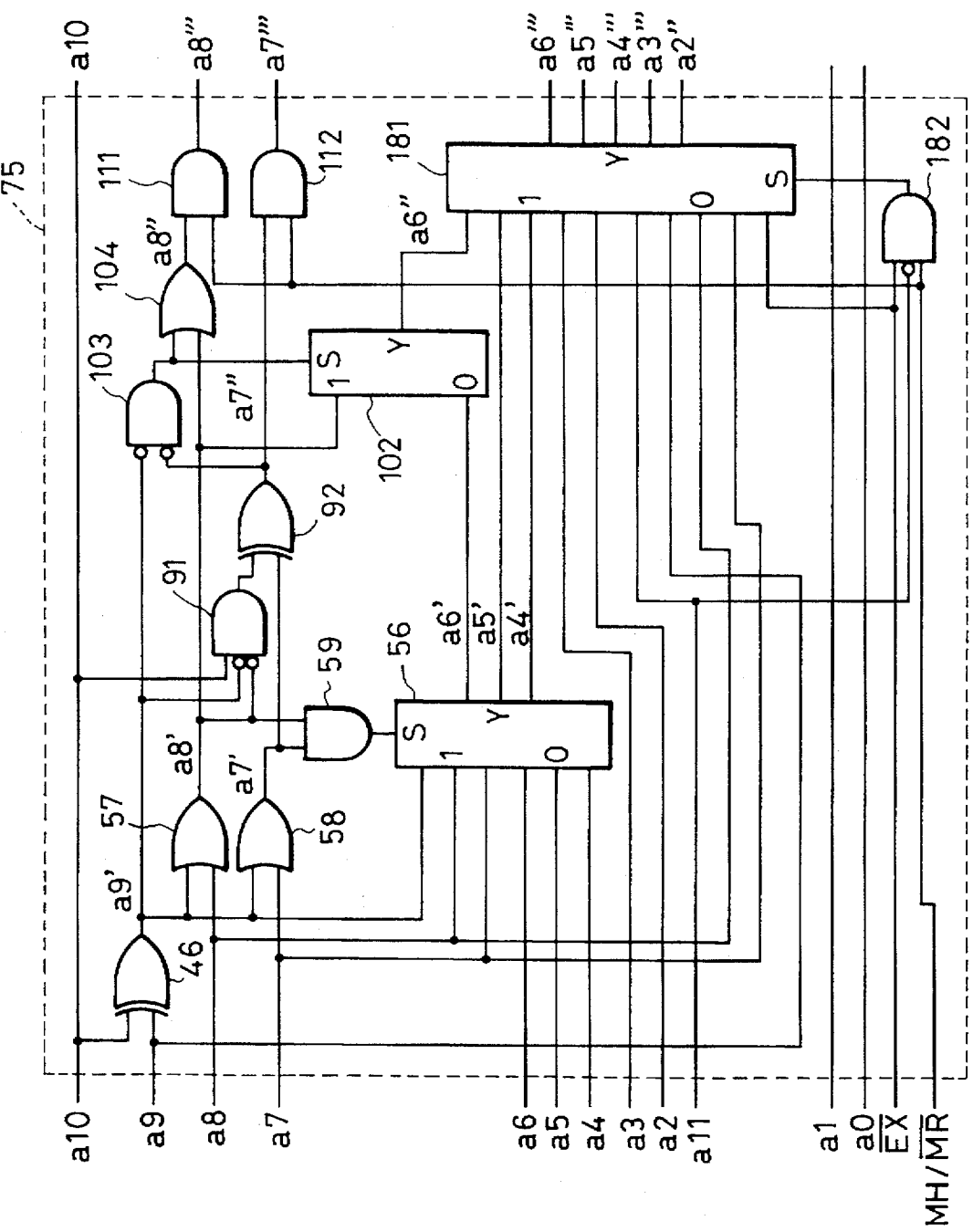
FIG. 17 is a circuit diagram of an address compressor in accordance with the fourth embodiment of the present invention.
Figure 18:
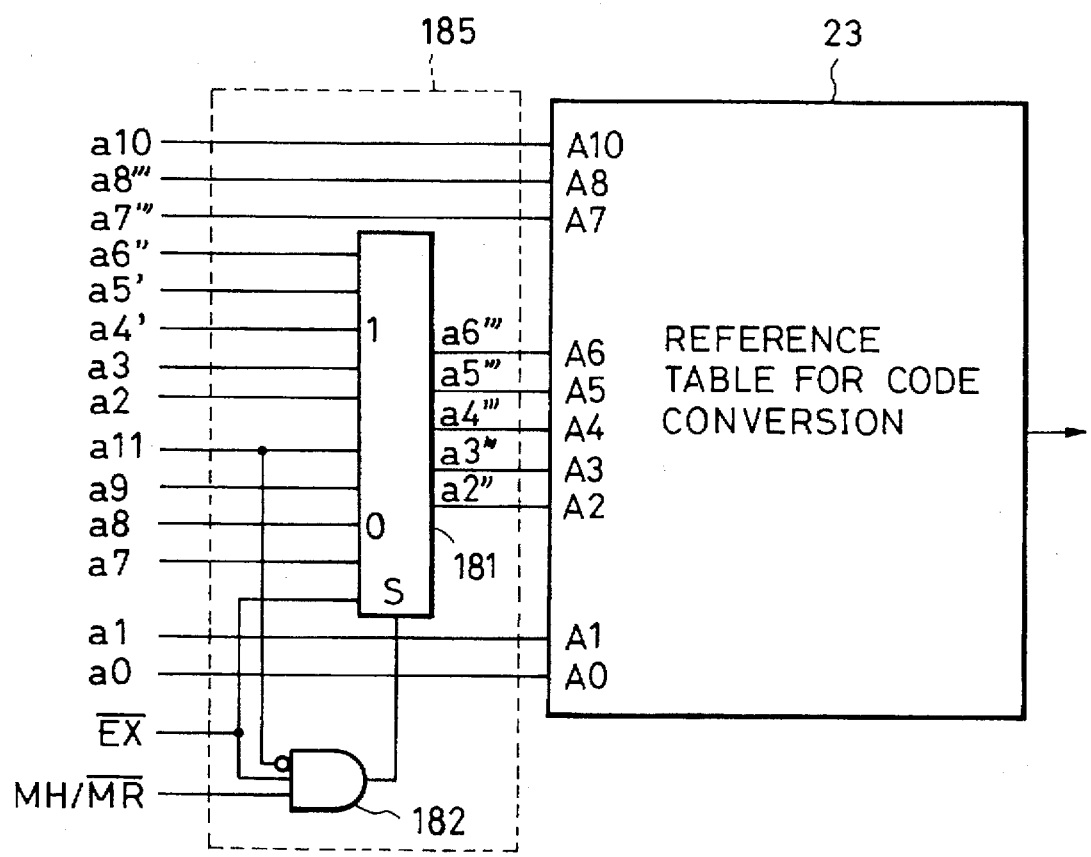
FIG. 18 shows a realization process of the fourth embodiment of the present invention.

FIG. 16 shows a fourth embodiment of the present invention. Decoded data of the EX code for the expansion mode and decoded data of the EOL code are further stored in the reference table 23 for code conversion. The MH/$\overline{MR}$ signal indicating the type of codes to be decoded and the $\overline{EX}$ signal, in addition to the signal to the address compressor 15 of FIG. 2, are input to an address compressor 75 of FIG. 16. FIG. 17 shows the construction of the address compressor 75 in accordance with the fourth embodiment. FIG. 18 shows a realization process of the address compressor 75 in accordance with the fourth embodiment.

FIG. 18 shows the next stage of FIG. 11B shown in the realization process of the above-described second embodiment. An output of an AND circuit 182 is connected to select signal input terminal S of a selector circuit 181, an MH/$\overline{MR}$ signal for switching between the MR mode and the MH mode is connected to one of the inputs of the AND circuit 182, and the expansion mode signal $\overline{EX}$ is connected to another input of the AND circuit 182, and the inversion of signal a11 indicating that the number of leading zeros of the code is 8 or more is connected to the remaining input of the AND circuit 182. When the output of the AND circuit 182 is "1", a6", a5', a4', a3 and a2 signal inputs are output via the selector circuit 181 to a6"", a5"", a4"", a3"' and a2", respectively. When the output of the AND circuit 182 is "0", all, a9, a8, a7 and $\overline{EX}$ signal inputs are output via the selector circuit 181 to a6"", a5"", a4"", a3"' and a2", respectively, and connected to terminals A6, A5, A4, A3 and A2 of the reference table 23 for code conversion, respectively. A signal which becomes "1" when the number of leading zeros of the code is 8 or more is input to signal input a11. As a result, input signals a11, a9, a8 and a7 form an encoder output which counts the number of leading zeros of the code from 0 to 15.

The $\overline{EX}$ signal, when "0", indicates the decode state in the expansion mode in which the selector circuit 181 outputs a11, a9, a8, a7 and $\overline{EX}$ to a6"", a5"", a4"", a3"' and a2", and since $\overline{EX}$ is "0", "0" is always to input A2. In the MR mode in which MH/$\overline{MR}$ is "0", on the other hand, the selector circuit 181 outputs a11, a9, a8, a7, and $\overline{EX}$ to a6"", a5"", a4"", a3"' and a2", and since $\overline{EX}$ is "1", "1" is always to input A2. When a11 is "1" and the number of leading zeros of the code is 8 or more, the selector circuit 181 outputs a11, a9, a8, a7 and $\overline{EX}$ to a6"", a5"", a4"", a3"' and a2". At this time, the reference table 23 for code conversion can be formed in such a way that when the number of leading zeros of the code is 11, the EOL detection signal is output. Further, it is possible to form the reference table 23 for code conversion in such a way that when the number of leading zeros of the code is 12, one NULL code and EOL are output, when the number of zeros is 13, two NULL codes and EOL are output, when the number of zeros is 14, three NULL codes and EOL are output, when the number of zeros is 15, NULL code detection information in which there are four consecutive NULL codes is output.

TABLE 1

Terminating Code

| Run Length of White | Code | Run Length of Black | Code |
|---|---|---|---|
| 0 | 00110101 | 0 | 0000110111 |
| 1 | 000111 | 1 | 010 |
| 2 | 0111 | 2 | 11 |
| 3 | 1000 | 3 | 10 |
| 4 | 1011 | 4 | 011 |
| 5 | 1100 | 5 | 0011 |
| 6 | 1110 | 6 | 0010 |
| 7 | 1111 | 7 | 00011 |
| 8 | 10011 | 8 | 000101 |
| 9 | 10100 | 9 | 000100 |
| 10 | 00111 | 10 | 0000100 |
| 11 | 01000 | 11 | 0000101 |
| 12 | 001000 | 12 | 0000111 |
| 13 | 000011 | 13 | 00000100 |
| 14 | 110100 | 14 | 00000111 |
| 15 | 110101 | 15 | 000011000 |
| 16 | 101010 | 16 | 0000010111 |
| 17 | 101011 | 17 | 0000011000 |
| 18 | 0100111 | 18 | 0000001000 |
| 19 | 0001100 | 19 | 00001100111 |
| 20 | 0001000 | 20 | 00001101000 |
| 21 | 0010111 | 21 | 00001101100 |
| 22 | 0000011 | 22 | 00000110111 |
| 23 | 0000100 | 23 | 00000101000 |
| 24 | 0101000 | 24 | 00000010111 |
| 25 | 0101011 | 25 | 00000011000 |
| 26 | 0010011 | 26 | 000011001010 |
| 27 | 0100100 | 27 | 000011001011 |
| 28 | 0011000 | 28 | 000011001100 |
| 29 | 00000010 | 29 | 000011001101 |
| 30 | 00000011 | 30 | 000001101000 |
| 31 | 00011010 | 31 | 000001101001 |
| 32 | 00011011 | 32 | 000001101010 |
| 33 | 00010010 | 33 | 000001101011 |
| 34 | 00010011 | 34 | 000011010010 |
| 35 | 00010100 | 35 | 000011010011 |

TABLE 2

Terminating Code (Continued)

| Run Length of White | Code | Run Length of Black | Code |
|---|---|---|---|
| 36 | 00010101 | 36 | 000011010100 |
| 37 | 00010110 | 37 | 000011010101 |
| 38 | 00010111 | 38 | 000011010110 |
| 39 | 00101000 | 39 | 000011010111 |
| 40 | 00101001 | 40 | 000001101100 |
| 41 | 00101010 | 41 | 000001101101 |
| 42 | 00101011 | 42 | 000011011010 |
| 43 | 00101100 | 43 | 000011011011 |
| 44 | 00101101 | 44 | 000001010100 |
| 45 | 00000100 | 45 | 000001010101 |
| 46 | 00000101 | 46 | 000001010110 |
| 47 | 00001010 | 47 | 000001010111 |
| 48 | 00001011 | 48 | 000001100100 |
| 49 | 01010010 | 49 | 000001100101 | forming means for forming address data by performing a logical operation on data indicating a color represented by the code, on data indicating the number of zero bits detected by said detecting means, and on data for the code excluding the consecutive leading zero bits and a next one bit of the code; and decoding means comprising a table which is addressed by the address data formed by said forming means and which outputs a decoded result corresponding to the code, wherein the data length of the address data formed by said forming means is shorter than that of data obtained by concatenating the data indicating the color, the data indicating the number of zero bits, and the data for the code excluding the consecutive leading zero bits and the next one bit of the code.

2. A decoding apparatus according to claim 1, wherein said forming means forms the address data so as to reduce the data length of the address data by which the table is accessed.

3. A decoding apparatus according to claim 1, wherein the table outputs decoded results corresponding to codes having different numbers of leading zero bits at the beginning of said codes by accessing the same address space.

4. A decoding apparatus according to claim 1, wherein the table outputs a decoded result corresponding to a Modified Huffman code whose number of consecutive leading zero bits is a predetermined value by accessing the address space for accessing the decoded result corresponding to a Modified Huffman code whose number of consecutive leading zero bits is different from the predetermined value, and outputs a decoded result corresponding to a Modified READ code by accessing the address space for accessing the decoded result corresponding to the Modified Huffman code whose number of consecutive leading zero bits is the predetermined value.

5. A decoding method for decoding codes which have been generated by encoding image data in accordance with one of Modified Huffman, Modified READ and Modified Modified READ encoding methods, said method comprising the steps of:

detecting a number of consecutive leading zero bits of a code to be decoded;

forming address data by performing a logical operation on data indicating a color represented by the code, on data indicating the number of detected zero bits, and on data for the code excluding the consecutive leading zero bits and a next one bit of the code; and outputting a decoded result corresponding to the code by accessing a table on the basis of the formed address data, wherein the data length of the address data formed in said forming step is shorter than that of data obtained by concatenating the data indicating the color, the data indicating the number of zero bits and the data for the code excluding the consecutive leading zero bits and the next one bit of the code.

6. A decoding method according to claim 5, wherein the address data is formed in said forming step so as to reduce the data length of the address data by which the table is accessed.

7. A decoding method according to claim 5, wherein the table outputs decoded results corresponding to codes having different numbers of leading zero bits at the beginning of said codes by accessing the same address space.

8. A decoding method according to claim 5, wherein the table outputs a decoded result corresponding to a Modified Huffman code whose number of consecutive leading zero bits is a predetermined value by accessing the address space for accessing the decoded result corresponding to a Modified Huffman code whose number of consecutive leading zero bits is different from the predetermined value, and outputs a decoded result corresponding to a Modified READ code by accessing the address space for accessing the decoded result corresponding to the Modified Huffman code whose number of consecutive leading zero bits is the predetermined value.

* * * * *